(12) United States Patent
Govind et al.

(10) Patent No.: US 6,531,932 B1
(45) Date of Patent: Mar. 11, 2003

(54) MICROSTRIP PACKAGE HAVING OPTIMIZED SIGNAL LINE IMPEDANCE CONTROL

(75) Inventors: Anand Govind, Fremont, CA (US); Farshad Ghahghahi, Los Gatos, CA (US); Aritharan Thurairajaratnam, Fremont, CA (US)

(73) Assignee: LSI Logic Corporation, Milpitas, CA (US)

( * ) Notice: Subject to any disclaimer, the term of this patent is extended or adjusted under 35 U.S.C. 154(b) by 23 days.

(21) Appl. No.: 09/894,210

(22) Filed: Jun. 27, 2001

(51) Int. Cl.[7] .............................. H01P 3/08; H03H 7/38
(52) U.S. Cl. ........................................ 333/34; 333/238
(58) Field of Search ........................... 333/33, 12, 34, 333/238

(56) References Cited

U.S. PATENT DOCUMENTS

| | | | | |
|---|---|---|---|---|
| 3,593,174 A | * | 7/1971 | White | 330/53 |
| 4,362,899 A | * | 12/1982 | Borrill | 174/36 |
| 5,376,588 A | | 12/1994 | Pendse | 257/666 |
| 5,696,027 A | | 12/1997 | Crane, Jr. | 438/612 |
| 5,952,726 A | | 9/1999 | Liang | 257/778 |
| 6,048,753 A | | 4/2000 | Farnworth | 438/111 |
| 6,064,113 A | | 5/2000 | Kirkman | 257/691 |
| 6,111,756 A | | 8/2000 | Moresco | 361/735 |
| 6,198,635 B1 | | 3/2001 | Shenoy et al. | 361/760 |

OTHER PUBLICATIONS

"Direct Rambus ASIC Package Selection Guide Version 0.1", Nov. 1999, Rambus Inc.

* cited by examiner

*Primary Examiner*—Stephen Jones
(74) *Attorney, Agent, or Firm*—Sawyer Law Group, LLP

(57) ABSTRACT

A method for fabricating a microstrip package to optimize signal trace impedance control is disclosed. The method includes patterning a plurality of signal traces on a multilayer substrate, and patterning a plurality of guard traces on the multilayer substrate, that are interspersed alternately among the signal traces to provide noise shielding between the signal traces. In a further embodiment, the traces are patterned on the substrate with a width that is adjusted at different locations based on the presence the guard traces to enable the package to meet a particular impedance requirement.

10 Claims, 4 Drawing Sheets

MICROSTRIP PACKAGE HAVING OPTIMIZED SIGNAL LINE IMPEDANCE CONTROL

FIELD OF THE INVENTION

The present invention relates to flip chip packages, and more particularly to the design of a trace layout in a flip chip package to optimize signal line impedance control.

BACKGROUND OF THE INVENTION

FIG. 1A is a cross sectional view showing the layer stack up of a typical microstrip 4-layer flip chip package substrate. The substrate 12 is typically a printed circuit board or the like. Layer 1 of the substrate 12 located on the top of the substrate 12 and is a top signal layer 14, and layer 2, is a ground plane (Vss) 16. Layer 3 is a power plane (Vdd) 18, and layer 4 is a bottom signal layer 20. As shown in FIG. 1B illustrating a top view of the 4-layer flip-chip substrate 12, a pattern of signal traces 30 are patterned on the top signal layer 14. Referring again to FIG. 1A, a die 22 is connected to the signal traces 30 on the top signal layer 14 by way of solder bumps 24. Although not illustrated, the bottom signal layer 20 may also include a pattern of signal traces that are also connected to the solder bumps on the die 22 through vias (not shown).

Microstrip constructions in which the signal traces 30 of one layer can only reference one plane, as shown in FIGS. 1A and 1B, are susceptible to noise. Noise can be caused by several sources. For example, as high speed signals pass through each signal trace 30, field lines are generated around the signal traces 30 that cause cross talk among adjacent traces 30. Another source of noise includes signal reflections from discontinuities in the package and board during signal transmission. Such discontinuities are more in a microstrip substrate since the traces 30 on the top layer may be affected by the assembly materials such as the stiffener used. A metallic stiffener can act as a floating plane and cause impedance variation in the traces 30.

Because the efficiency at which signals are shielded from noise and discontinuities in the signal transmission is inadequate in microstrip constructions, microstrip flip-chip packages are unsuitable for applications having critical signal I/O's that require precise impedance control and minimum noise.

One method for minimizing noise is to use stripline construction for the package substrate. FIG. 1C is a cross sectional view showing the layer stack up of a conventional stripline 6-layer flip-chip package substrate. Stripline construction minimizes noise because additional layers are included for carrying power and ground planes 16' and 18', which sandwich the signals 14' and 20' between power and ground planes 16' and 18'. Although stripline construction is more effective at reducing noise than microstrip construction, stripline construction cost more due to the additional layers.

Accordingly, what is needed a method for fabricating a microstrip package that achieves a precise characteristic impedance required for specialized signal I/O's and optimum noise shielding and at low cost without adding additional layers. The present invention addresses such a need.

SUMMARY OF THE INVENTION

The present invention provides a method for fabricating a microstrip package to optimize signal trace impedance control and cross talk noise shielding. The method includes patterning a plurality of signal traces on a multilayer substrate, and patterning a plurality of guard traces on the multilayer substrate interspersed alternately among the signal traces to provide noise shielding between the signal traces. In a further embodiment, the traces are patterned on the substrate with a width that is adjusted at different locations based on the presence the guard traces to enable the package to meet a particular impedance requirement.

According to the system and method disclosed herein, the present invention achieves a precise characteristic impedance required for specialized signal IO's and optimum noise shielding without adding additional layers and at low cost.

DETAILED DESCRIPTION

The present invention relates to optimized impedance control for a trace layout on a multilayer substrate. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown but is to be accorded the widest scope consistent with the principles and features described herein.

The present invention provides a method for fabricating a trace layout for a multilayer substrate that optimizes impedance control and signal cross talk noise reduction. Whereas generic flip-chip packages are designed to achieve signal I/O's of 50 ohms impedance, the present invention discloses a design for matching an impedance requirement for achieving signal I/O's of 28 ohms +/−10%. This requirement is met with minimum package cost by using only a 4-layer package construction without the need for stripline construction.

Figure 2:
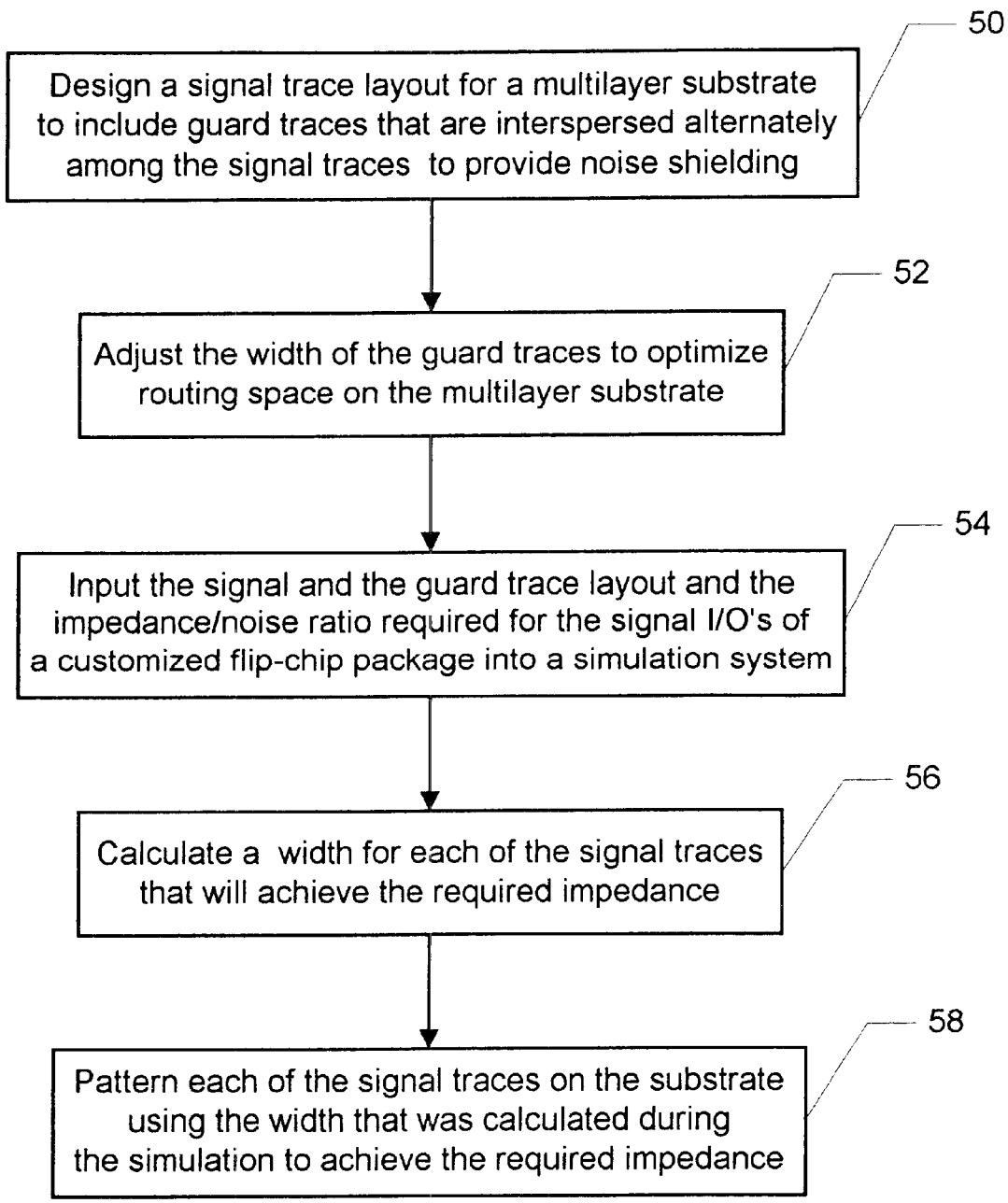
FIG. 2 is a flow chart illustrating the method for fabricating a microstrip 4-layer flip-chip package substrate that optimizes impedance control in accordance with a preferred embodiment of the present invention.

FIG. 2 is a flow chart illustrating the method for fabricating a microstrip 4-layer flip chip package substrate 12 that optimizes impedance control in accordance with a preferred embodiment of the present invention. The process begins by designing a signal trace layout for a multilayer substrate 12 to include guard traces in step 50, where the guard traces are interspersed alternately among the signal traces 30 to provide noise shielding between the signal traces 30.

Figure 1A:
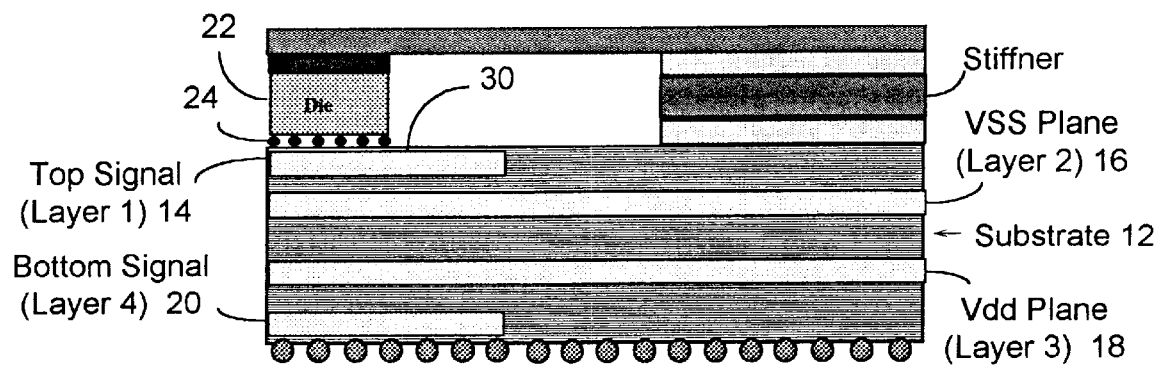
FIG. 1A is a cross sectional view showing the layer stack up of a conventional microstrip 4-layer flip-chip package substrate.
Figure 1B:
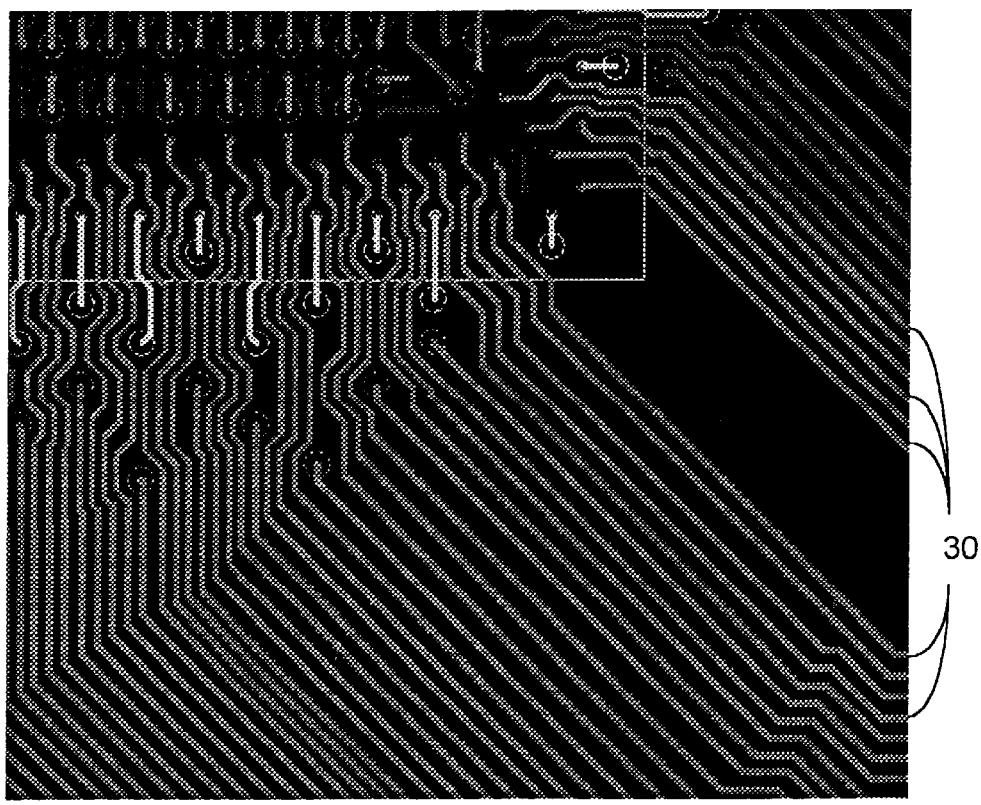
FIG. 1B is a diagram illustrating a top view of the 4-layer flip-chip. substrate.
Figure 1C:
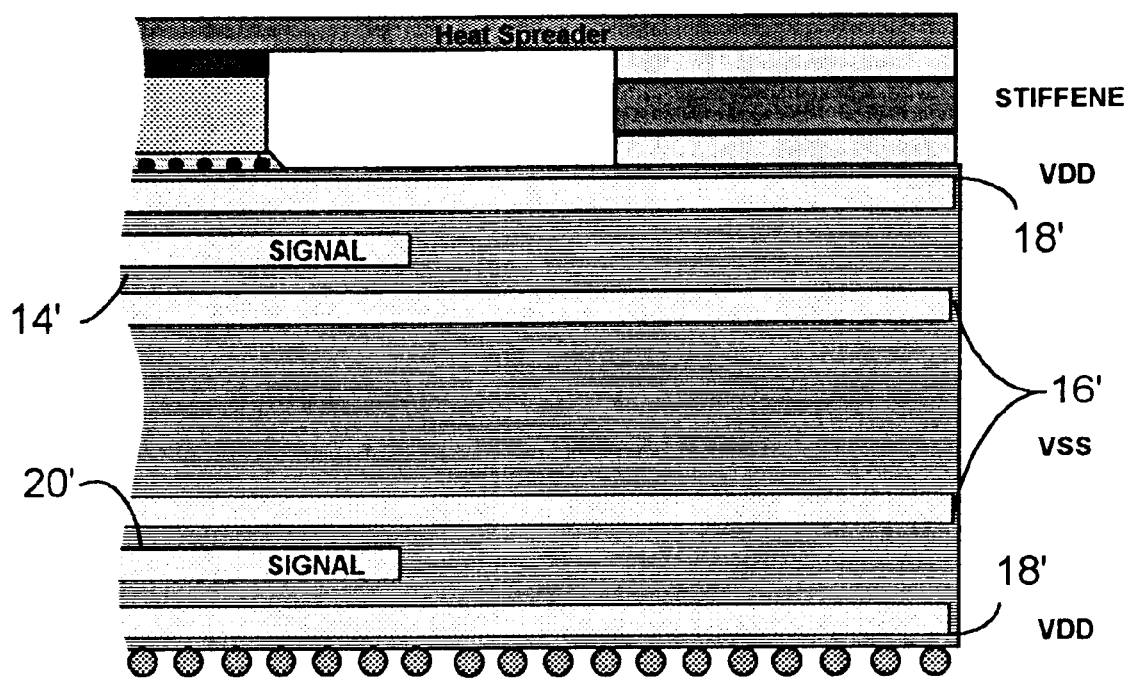
FIG. 1C is a cross sectional view showing the layer stack up of a conventional stripline 6-layer flip-chip package substrate.
Figure 3:
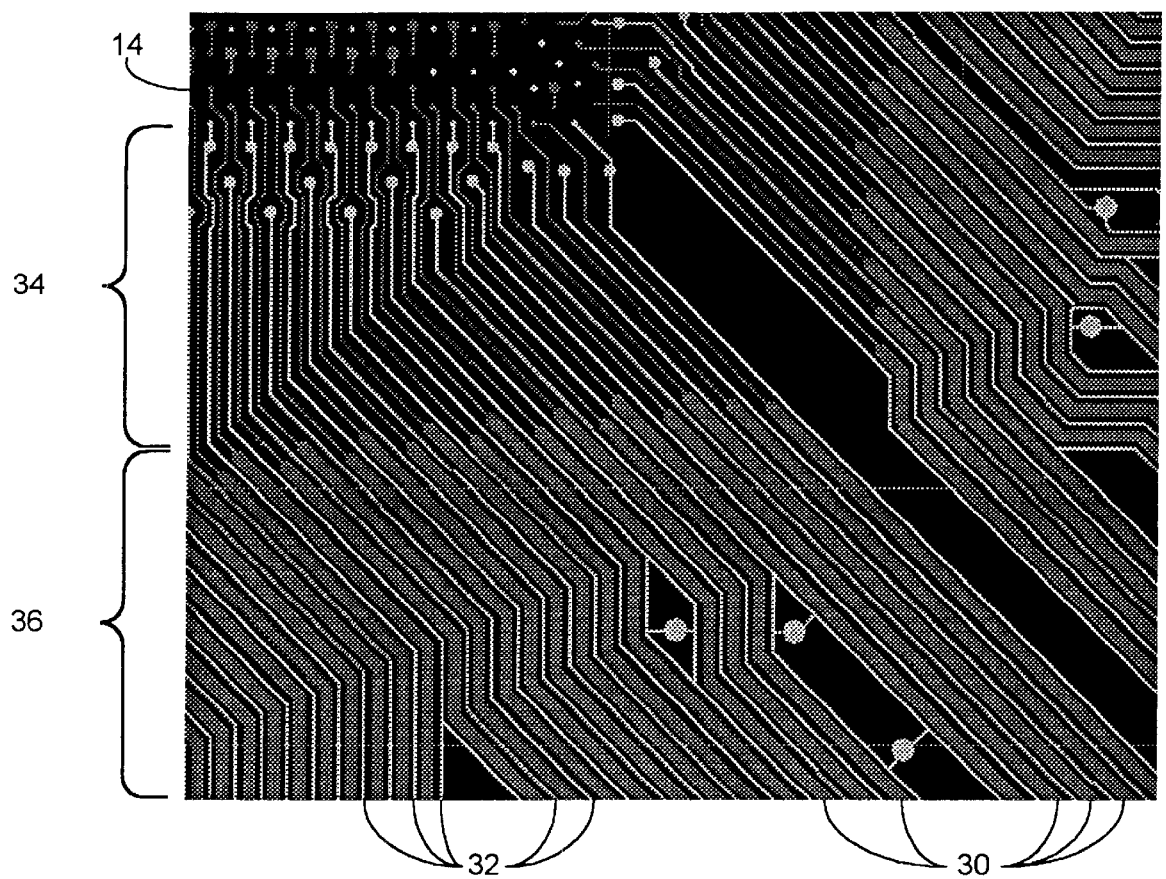
FIG. 3 is a diagram of the top view of a customized multi-layer flip-chip substrate showing a portion of the top signal layer.

FIG. 3 is a diagram of the top view of a customized multi-layer flip-chip substrate 28 showing a portion of the top signal layer 14, where like reference numerals of FIGS. 1A and 1B denote like components. According to the present invention, at least one guard trace 32 is located between adjacent signal traces 30 on the customized multilayer substrate 28. Each guard trace 32 is connected to the ground plane 18 on the multilayer substrate 28 through vias (not shown). According to the present invention, the guard traces 32 in effect act as a local plane between the signals, thereby protecting the signals from cross talk and achieving noise reduction without adding additional planes to the substrate 28.

Referring again to FIG. 2, in addition to providing the noise shielding requirement, the width of the guard traces 32 is adjusted to optimize routing space on the multiplayer substrate 28 in step 52. In a preferred embodiment, the guard traces 32 are made as wide as possible without violating minimum spacing design rules, of the customized flip-chip package.

The signal and the guard trace layout along with a particular impedance/noise ratio required for the signal I/O's of the customized flip-chip package, and the physical construction & dielectric properties of the package cross section are then input into a simulation system in step 54. Based on these design parameters, the simulation calculates a width for each of the signal traces 30 that will achieve the required impedance in step 56.

According to the present invention, each signal trace on the substrate 28 is designed with a narrow segment 34 and a wide segment 36, as shown in FIG. 3. The length & width of the narrow segment 34 is an input parameter to the simulation. If, for example, input to the simulation is a 28-ohm impedance requirement and 3.225 mm for the narrow segment 34, then simulation may calculate a width for the wide segment 36 of the signal traces 30 of 110 um).

Referring to both FIGS. 2 and 3, the signal traces 30 are then patterned on the substrate 28 using the width that was calculated during the simulation to achieve the required impedance in step 58. Accordingly, the traces 30 are patterned on the substrate with a width that is adjusted at different locations based on the presence the guard traces 32 to enable the package to meet a particular impedance requirement.

According to the impedance control design of present invention, cross talk noise between signals is minimized without the need for additional layers on the substrate 28 or expensive multilayer stripline construction. In addition, because the line widths are optimized to match the required signal characteristic impedance, discontinuities between the package and the system board are also minimized.

A microstrip package having optimized signal line impedance control and reduced cross talk noise has been disclosed. The present invention has been described in accordance with the embodiments shown, and one of ordinary skill in the art will readily recognize that there could be variations to the embodiments, and any variations would be within the spirit and scope of the present invention. For example, although the method for optimizing impedance control of present invention has been described in terms of flip chip packaging, the present invention can be used for other types of packaging where the number of substrate layers need to be kept to a minimum, such as wire bond, tab, and so on. Accordingly, many modifications may be made by one of ordinary skill in the art without departing from the spirit and scope of the appended claims.

What is claimed is:

1. A package substrate having optimized impedance control, comprising: at most four layers;
    a plurality of signal traces on a first layer, wherein the signal traces are patterned with a narrow segment and a wide segment, such that a width of the wide segment enables the signal traces to meet an impedance requirement of the microstrip package; and
    a plurality of guard traces on the first layer alternately interspersed among the signal traces to provide noise shielding, wherein the guard trace widths are adjusted to optimize routing space on the multilayer substrate.

2. The package of claim 1 wherein the guard traces are connected to a ground plane on the substrate.

3. The package of claim 1 wherein one guard trace is located between each pair of signal traces.

4. A method for fabricating a microstrip package to optimize signal trace impedance control, the microstrip package having an impedance requirement of less than 50 ohms, the method including the steps of:
    (a) patterning a plurality of signal traces on a multilayer substrate with a narrow segment and a wide segment, wherein a width of the wide segment enables the signal traces to meet the impedance requirement of the microstrip package; and
    (b) patterning a plurality of guard traces on the multilayer substrate, wherein the guard traces are interspersed alternately among the signal traces to provide noise shielding between the signal traces, wherein a width of the guard traces is adjusted to optimize routing space on the multilayer substrate.

5. The method of claim 4 further including the step of connecting the guard traces to a ground plane on the multilayer substrate.

6. The method of claim 5 further including the step of providing one guard trace between each pair of signal traces.

7. A method for fabricating a microstrip package to optimize signal trace impedance control, the method including the steps of:
    (a). designing a trace layout for a multilayer substrate having a plurality of signal traces with an alternating pattern of guard traces and signal traces, wherein a width of the guard traces is adjusted to optimize routing space on the multilayer substrate;
    (b) calculating what signal trace width will yield a desired impedance/noise ratio based on the trace layout of the signal traces and the guard traces; and
    (c) patterning each of the signal traces on the substrate with the calculated signal trace width.

8. The method of claim 7 further including the step of connecting the guard traces to a ground plane on the multilayer substrate.

9. The method of claim 8 further including the step of providing one guard trace between each pair of signal traces.

10. The method of claim 9 further including the step of patterning a portion of the signal traces with first and second segments.

* * * * *